(12) United States Patent
Minsek et al.

(10) Patent No.: US 9,443,713 B2
(45) Date of Patent: Sep. 13, 2016

(54) OXIDIZING AQUEOUS CLEANER FOR THE REMOVAL OF POST-ETCH RESIDUES

(71) Applicant: ADVANCED TECHNOLOGY MATERIALS, INC., Danbury, CT (US)

(72) Inventors: David W. Minsek, New Milford, CT (US); Michael B. Korzenski, Bethel, CT (US); Martha M. Rajaratnam, Ridgefield, CT (US)

(73) Assignee: ADVANCED TECHNOLOGY MATERIALS, INC., Danbury, CT (US)

( * ) Notice: Subject to any disclaimer, the term of this patent is extended or adjusted under 35 U.S.C. 154(b) by 122 days.

(21) Appl. No.: 14/321,180

(22) Filed: Jul. 1, 2014

(65) Prior Publication Data
US 2015/0000697 A1    Jan. 1, 2015

Related U.S. Application Data

(63) Continuation of application No. 13/084,173, filed on Apr. 11, 2011, now Pat. No. 8,765,654, which is a
(Continued)

(51) Int. Cl.
*C11D 3/20* (2006.01)
*H01L 21/02* (2006.01)
(Continued)

(52) U.S. Cl.
CPC .......... *H01L 21/02057* (2013.01); *C09G 1/02* (2013.01); *C11D 7/06* (2013.01); *C11D 7/3209* (2013.01); *C11D 11/0047* (2013.01);
(Continued)

(58) Field of Classification Search
CPC ... C11D 11/0047; C11D 7/3209; C11D 3/30; C11D 3/43; C11D 7/265
See application file for complete search history.

(56) References Cited

U.S. PATENT DOCUMENTS

| | | | |
|---|---|---|---|
| 4,443,295 A | 4/1984 | Radigan et al. | |
| 6,200,910 B1 | 3/2001 | O'Brien et al. | |

(Continued)

FOREIGN PATENT DOCUMENTS

| | | |
|---|---|---|
| KR | 1020040074611 A | 8/2004 |
| KR | 1020050094409 A | 9/2005 |
| WO | 2006133253 A1 | 12/2006 |

OTHER PUBLICATIONS

Taiwanese Office Action, Oct. 13, 2012.
(Continued)

*Primary Examiner* — Gregory Webb
(74) *Attorney, Agent, or Firm* — Tristan A. Fuierer; Moore & Van Allen, PLLC; Maggie Chappuis

(57) ABSTRACT

An oxidizing aqueous cleaning composition and process for cleaning post-plasma etch residue and/or hardmask material from a microelectronic device having said residue thereon. The oxidizing aqueous cleaning composition includes at least one oxidizing agent, at least one oxidizing agent stabilizer comprising an amine species selected from the group consisting of primary amines, secondary amines, tertiary amines and amine-N-oxides, optionally at least one co-solvent, optionally at least one metal-chelating agent, optionally at least one buffering species, and water. The composition achieves highly efficacious cleaning of the residue material from the microelectronic device while simultaneously not damaging the interlevel dielectric and metal interconnect material also present thereon.

15 Claims, 4 Drawing Sheets

Related U.S. Application Data continuation of application No. 12/089,288, filed as application No. PCT/US2006/038930 on Oct. 4, 2006, now Pat. No. 7,922,824.

(60) Provisional application No. 60/745,316, filed on Apr. 21, 2006, provisional application No. 60/745,251, filed on Apr. 20, 2006, provisional application No. 60/723,776, filed on Oct. 5, 2005.

(51) Int. Cl.

| | | |
|---|---|---|
| *C09G 1/02* | (2006.01) | |
| *C23G 1/06* | (2006.01) | |
| *C23G 1/10* | (2006.01) | |
| *C23G 1/18* | (2006.01) | |
| *C23G 1/20* | (2006.01) | |
| *G03F 7/42* | (2006.01) | |
| *H01L 21/311* | (2006.01) | |
| *H01L 21/321* | (2006.01) | |
| *H01L 21/3213* | (2006.01) | |
| *C11D 11/00* | (2006.01) | |
| *C11D 7/06* | (2006.01) | |
| *C11D 7/32* | (2006.01) | |
| *C11D 3/33* | (2006.01) | |
| *C11D 3/39* | (2006.01) | |
| *C23G 1/02* | (2006.01) | |

(52) U.S. Cl.
CPC ............... *C23G1/061* (2013.01); *C23G 1/103* (2013.01); *C23G 1/106* (2013.01); *C23G 1/18* (2013.01); *C23G 1/205* (2013.01); *G03F 7/425* (2013.01); *H01L 21/02063* (2013.01); *H01L 21/31144* (2013.01); *H01L 21/3212* (2013.01); *H01L 21/32134* (2013.01); *C11D 3/33* (2013.01); *C11D 3/3942* (2013.01); *C23G 1/02* (2013.01); *G03F 7/426* (2013.01)

(56) References Cited

U.S. PATENT DOCUMENTS

| | | | |
|---|---|---|---|
| 6,417,147 | B2 | 7/2002 | Amemiya et al. |
| 6,546,939 | B1* | 4/2003 | Small ................ B08B 3/08 134/1.2 |
| 6,599,370 | B2 | 7/2003 | Skee |
| 6,692,546 | B2 | 2/2004 | Ma et al. |
| 6,773,873 | B2 | 8/2004 | Seijo et al. |
| 6,849,200 | B2 | 2/2005 | Baum et al. |
| 7,029,373 | B2 | 4/2006 | Ma et al. |
| 7,419,911 | B2 | 9/2008 | Chelle et al. |
| 7,419,945 | B2 | 9/2008 | Hsu |
| 7,922,824 | B2 | 4/2011 | Minsek et al. |
| 8,765,654 | B2 | 7/2014 | Minsek et al. |
| 2001/0056052 | A1 | 12/2001 | Aoki et al. |
| 2002/0077259 | A1* | 6/2002 | Skee ............... C11D 3/0073 510/175 |
| 2003/0148624 | A1 | 8/2003 | Ikemoto et al. |
| 2004/0038840 | A1 | 2/2004 | Lee et al. |
| 2004/0134873 | A1* | 7/2004 | Yao ................ C09G 1/02 216/2 |
| 2004/0180300 | A1* | 9/2004 | Minsek ............ C11D 7/06 430/329 |
| 2004/0224866 | A1 | 11/2004 | Matsunaga et al. |
| 2004/0229461 | A1 | 11/2004 | Darsillo et al. |
| 2005/0197265 | A1 | 9/2005 | Rath et al. |
| 2005/0287480 | A1 | 12/2005 | Takashima |
| 2006/0073997 | A1 | 4/2006 | Leonte et al. |
| 2006/0154186 | A1 | 7/2006 | Minsek et al. |
| 2008/0242574 | A1 | 10/2008 | Rath et al. |
| 2009/0163396 | A1* | 6/2009 | Hsu ............... C11D 3/3947 510/176 |
| 2012/0302483 | A1 | 11/2012 | Minsek et al. |

OTHER PUBLICATIONS

Korean Office Action, Apr. 12, 2013.

\* cited by examiner

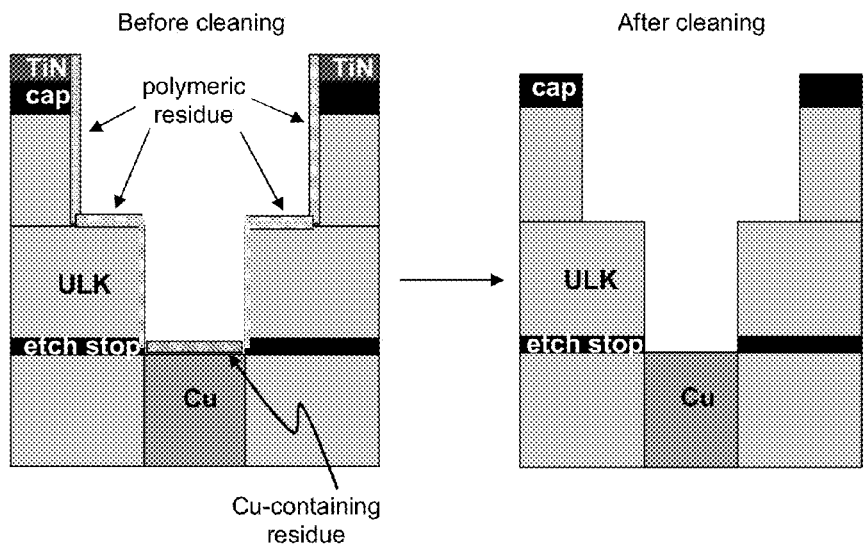
FIGURE 1A  FIGURE 1B
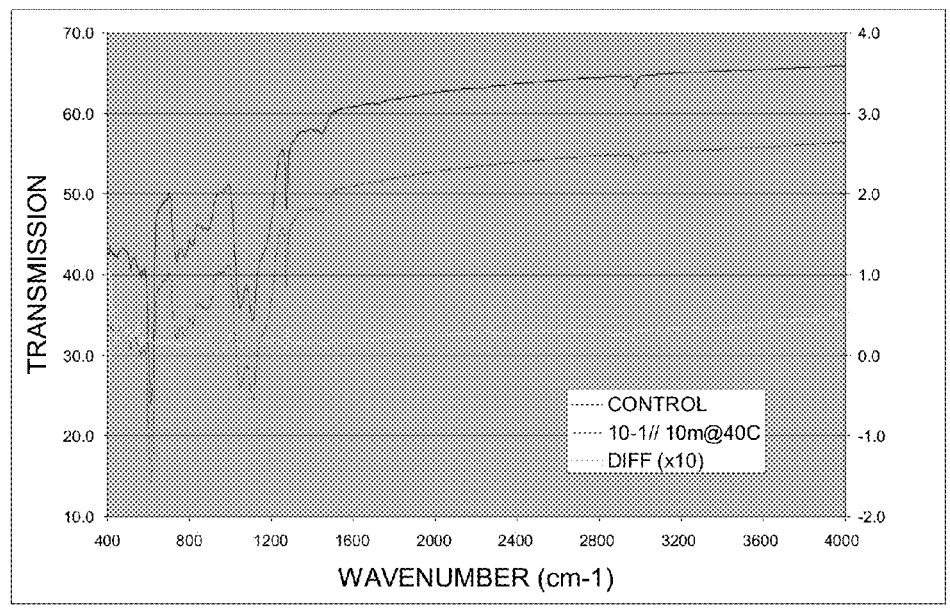
FIGURE 2

OXIDIZING AQUEOUS CLEANER FOR THE REMOVAL OF POST-ETCH RESIDUES

This application is filed under the provisions of 35 U.S.C. §111(a) and is a continuation of U.S. patent application Ser. No. 13/084,173 filed on Apr. 11, 2011, now U.S. Pat. No. 8,765,564 issued on Jul. 1, 2014, which is a continuation of U.S. patent application Ser. No. 12/089,288 filed on Apr. 4, 2008, now U.S. Pat. No. 7,922,824 issued on Apr. 12, 2011, which claims priority to International Patent Application No. PCT/US2006/038930 filed on 4 Oct. 2006, which claims priority to U.S. Provisional Patent Application No. 60/723,776 filed on 5 Oct. 2005, U.S. Provisional Patent Application No. 60/745,251 filed on 20 Apr. 2006, and U.S. Provisional Patent Application No. 60/745,316 filed on 21 Apr. 2006, which are all hereby incorporated herein in their entireties.

FIELD OF THE INVENTION

The present invention relates to aqueous oxidizing compositions for the removal of post-etch residue and/or titanium-containing hardmask material from microelectronic devices and methods of making and using the same, wherein the oxidizing compositions have a high selectivity for titanium-containing materials relative to the interlevel dielectric (ILD) and metallic interconnect materials on the microelectronic device.

DESCRIPTION OF THE RELATED ART

Interconnect circuitry in semiconductor circuits consists of conductive metallic circuitry surrounded by insulating dielectric material. In the past, silicate glass vapor-deposited from tetraethylorthosilicate (TEOS) was widely used as the dielectric material, while alloys of aluminum were used for metallic interconnects.

Demand for higher processing speeds has led to smaller sizing of circuit elements, along with the replacement of TEOS and aluminum alloys by higher performance materials. Aluminum alloys have been replaced by copper or copper alloys due to the higher conductivity of copper. TEOS and fluorinated silicate glass (FSG) have been replaced by the so-called low-k dielectrics, including low-polarity materials such as organic polymers, hybrid organic/inorganic materials, organosilicate glass (OSG), and carbon-doped oxide (CDO) glass. The incorporation of porosity, i.e., air-filled pores, in these materials further lowers the dielectric constant of the material.

During dual-damascene processing of integrated circuits, photolithography is used to image a pattern onto a device wafer. Photolithography techniques comprise the steps of coating, exposure, and development. A wafer is coated with a positive or negative photoresist substance and subsequently covered with a mask that defines patterns to be retained or removed in subsequent processes. Following the proper positioning of the mask, the mask has directed therethrough a beam of monochromatic radiation, such as ultraviolet (UV) light or deep UV (DUV) light (≈250 nm or 193 nm), to make the exposed photoresist material more or less soluble in a selected rinsing solution. The soluble photoresist material is then removed, or "developed," thereby leaving behind a pattern identical to the mask.

Thereafter, gas-phase plasma etching is used to transfer the patterns of the developed photoresist coating to the underlying layers, which may include hardmask, interlevel dielectric (ILD), and/or etch stop layers. Post-plasma etch residues are typically deposited on the back-end-of-the-line (BEOL) structures and if not removed, may interfere with subsequent silicidation or contact formation. Post-plasma etch residues typically include chemical elements present on the substrate and in the plasma gases. For example, if a TiN hardmask is employed, e.g., as a capping layer over ILD, the post-plasma etch residues include titanium-containing species, which are difficult to remove using conventional wet cleaning chemistries. Moreover, conventional cleaning chemistries often damage the ILD, absorb into the pores of the ILD thereby increasing the dielectric constant, and/or corrode the metal structures. For example, buffered fluoride and solvent-based chemistries fail to completely remove TiN and Ti-containing residues, while hydroxylamine-containing and ammonia-peroxide chemistries corrode copper.

In addition to the desirable removal of titanium-containing hardmask and/or titanium-containing post-plasma etch residue, additional materials that are deposited during the post-plasma etch process such as polymeric residues on the sidewalls of the patterned device and copper-containing residues in the open via structures of the device are also preferably removed. To date, no single wet cleaning composition has successfully removed all of residue and/or hardmask material while simultaneously being compatible with the ILD, other low-k dielectric materials, and metal interconnect materials.

The integration of new materials, such as low-k dielectrics, into microelectronic devices places new demands on cleaning performance. At the same time, shrinking device dimensions reduce the tolerance for changes in critical dimensions and damage to device elements. Etching conditions can be modified in order to meet the demands of the new materials. Likewise, post-plasma etch cleaning compositions must be modified. Importantly, the cleaner should not damage the underlying dielectric material or corrode metallic interconnect materials, e.g., copper, tungsten, cobalt, aluminum, ruthenium, and silicides thereof, on the device.

Towards that end, it is an object of the present invention to provide improved aqueous compositions for the selective and effective removal of titanium-containing post-plasma etch residue, polymeric sidewall residue, copper-containing via residue and/or titanium-containing hardmask layers from microelectronic devices, said compositions being compatible with ILD and metal interconnect materials.

It is another object of the present invention to provide improved aqueous compositions having an extended bath-life relative to conventional peroxide-containing cleaning compositions.

SUMMARY OF THE INVENTION

The present invention generally relates to cleaning compositions and methods of making and using same. One aspect of the invention relates to an oxidizing aqueous composition and process for cleaning post-plasma etch residue and/or titanium-containing hardmask from microelectronic devices having said residue and/or hardmask thereon, while simultaneously not compromising the metallic and ILD materials on the microelectronic device surface. The oxidizing aqueous cleaning compositions of the invention include at least one oxidizing agent, at least one oxidizing agent stabilizer comprising an amine species selected from the group consisting of primary amines, secondary amines, tertiary amines and amine-N-oxides, optionally at least one organic co-solvent, optionally at least one metal-chelating agent, optionally at least one buffering species, and water.

In one aspect, the invention relates to an oxidizing aqueous cleaning composition, comprising at least one oxidizing agent, at least one oxidizing agent stabilizer comprising an amine species selected from the group consisting of primary amines, secondary amines, tertiary amines and amine-N-oxides, optionally at least one organic co-solvent, optionally at least one metal-chelating agent, optionally at least one buffering species, and water, wherein said aqueous cleaning composition is suitable for cleaning post-plasma etch residue and/or hardmask material from a microelectronic device having said residue and/or hardmask thereon.

In another aspect, the invention relates to a kit comprising, in one or more containers, one or more of the following reagents for forming an oxidizing aqueous cleaning composition, said one or more reagents selected from the group consisting of at least one oxidizing agent, at least one oxidizing agent stabilizer comprising an amine species selected from the group consisting of primary amines, secondary amines, tertiary amines and amine-N-oxides, optionally at least one co-solvent, optionally at least one chelating agent, optionally at least one buffering species, and water, and wherein the kit is adapted to form an oxidizing aqueous cleaning composition suitable for cleaning post-plasma etch residue and/or hardmask material from a microelectronic device having said residue and/or material thereon.

In still another aspect, the present invention relates to a method of removing post-plasma etch residue and/or hardmask material from a microelectronic device having said residue and/or hardmask thereon, said method comprising contacting the microelectronic device with an oxidizing aqueous cleaning composition for sufficient time to at least partially clean said residue and/or hardmask from the microelectronic device, wherein the oxidizing aqueous cleaning composition includes at least one oxidizing agent, at least one oxidizing agent stabilizer comprising an amine species selected from the group consisting of primary amines, secondary amines, tertiary amines and amine-N-oxides, optionally at least one organic co-solvent, optionally at least one metal-chelating agent, optionally at least one buffering species, and water.

Still another aspect of the invention relates to a oxidizing aqueous cleaning composition, comprising at least one oxidizing agent, at least one oxidizing agent stabilizer comprising an amine species selected from the group consisting of primary amines, secondary amines, tertiary amines and amine-N-oxides, at least one organic co-solvent, at least one metal-chelating agent, at least one buffering species, and water, wherein said aqueous cleaning composition is suitable for cleaning post-plasma etch residue and/or hardmask material from a microelectronic device having said residue and/or hardmask thereon.

In yet another aspect, the invention relates to an oxidizing aqueous cleaning composition, comprising hydrogen peroxide, at least one amine-N-oxide, optionally at least one organic co-solvent, optionally at least one metal-chelating agent, optionally at least one buffering species, and water, wherein said aqueous cleaning composition is suitable for cleaning post-plasma etch residue and/or hardmask material from a microelectronic device having said residue and/or hardmask thereon.

Still another aspect of the invention relates to an oxidizing aqueous cleaning composition comprising hydrogen peroxide, at least one amine-N-oxide, at least one organic co-solvent, at least one metal-chelating agent, at least one buffering species, and water, wherein said aqueous cleaning composition is suitable for cleaning post-plasma etch residue and/or hardmask material from a microelectronic device having said residue and/or hardmask thereon.

Another aspect of the invention relates to an oxidizing aqueous cleaning composition comprising hydrogen peroxide, at least one amine-N-oxide, diethylene glycol butyl ether, 1,2,4-triazole, tetramethylammonium hydroxide, citric acid, and water, wherein said aqueous cleaning composition is suitable for cleaning post-plasma etch residue and/or hardmask material from a microelectronic device having said residue and/or hardmask thereon.

Yet aspect of the invention relates to an oxidizing aqueous cleaning composition comprising hydrogen peroxide, at least one amine-N-oxide, diethylene glycol butyl ether, 1,2-cyclohexanediamine-N,N,N',N'-tetraacetic acid, tetramethylammonium hydroxide, boric acid, and water, wherein said aqueous cleaning composition is suitable for cleaning post-plasma etch residue and/or hardmask material from a microelectronic device having said residue and/or hardmask thereon.

A further aspect of the invention relates to an oxidizing aqueous cleaning composition comprising hydrogen peroxide, 1,2-cyclohexanediamine-N,N,N',N'-tetraacetic acid, boric acid, and water, wherein said aqueous cleaning composition is suitable for cleaning post-plasma etch residue and/or hardmask material from a microelectronic device having said residue and/or hardmask thereon.

A further aspect of the invention relates to a CMP slurry composition to remove barrier layer material from a microelectronic device substrate, said CMP slurry composition comprising abrasive, at least one oxidizing agent, at least one oxidizing agent stabilizer comprising an amine species selected from the group consisting of primary amines, secondary amines, tertiary amines and amine-N-oxides, at least one metal-chelating agent, optionally at least one organic co-solvent, optionally at least one buffering species, and water, wherein said CMP slurry composition is suitable for the selective removal of barrier layer material relative to metal interconnect and dielectric material layers.

Another aspect of the invention relates to a method of removing post-plasma etch residue from a microelectronic device having said residue thereon, said method comprising:
  contacting the microelectronic device with an oxidizing aqueous cleaning composition for sufficient time to at least partially clean said residue from the microelectronic device, wherein the oxidizing aqueous cleaning composition includes at least one oxidizing agent, at least one oxidizing agent stabilizer comprising an amine-N-oxide, optionally at least one organic co-solvent, optionally at least one metal-chelating agent, optionally at least one buffering species, and water; and
  contacting the microelectronic device with a dilute hydrofluoric acid solution for sufficient time to at least partially remove post-plasma etch residue from a metal interconnect material.

Another aspect of the invention relates to an article of manufacture comprising an aqueous cleaning composition, a microelectronic device, and post-plasma etch residue and/or hardmask material, wherein the aqueous composition includes at least one oxidizing agent, at least one oxidizing agent stabilizer comprising an amine species selected from the group consisting of primary amines, secondary amines, tertiary amines and amine-N-oxides, optionally at least one organic co-solvent, optionally at least one metal-chelating agent, optionally at least one buffering species, and water.

In a further aspect, the present invention relates to a method of manufacturing a microelectronic device, said method comprising contacting the microelectronic device with an oxidizing aqueous cleaning composition for sufficient time to at least partially remove post-plasma etch residue and/or hardmask material from the microelectronic device having said residue and/or material thereon, wherein the oxidizing aqueous composition includes at least one oxidizing agent, at least one oxidizing agent stabilizer comprising an amine species selected from the group consisting of primary amines, secondary amines, tertiary amines and amine-N-oxides, optionally at least one organic co-solvent, optionally at least one metal-chelating agent, optionally at least one buffering species, and water.

Yet another aspect of the invention relates to improved microelectronic devices, and products incorporating same, made using the methods of the invention comprising cleaning of post-plasma etch residue and/or hardmask material from the microelectronic device having said residue and/or material thereon, using the methods and/or compositions described herein, and optionally, incorporating the microelectronic device into a product.

Other aspects, features and advantages of the invention will be more fully apparent from the ensuing disclosure and appended claims.

BRIEF DESCRIPTION OF THE DRAWINGS

FIG. 1A illustrates a microelectronic device following post-plasma etch processing, wherein the sidewalls of the ultra low-k dielectric include polymeric residue and the copper via (or line) includes copper-containing residue thereon.

FIG. 1B illustrates the microelectronic device of FIG. 1A following cleaning using the oxidizing aqueous cleaning compositions of the present invention, wherein the polymeric residue, the copper-containing residue, and the TiN hardmask has been removed.

FIG. 2 is an FTIR spectrograph of a blanketed porous-CDO wafer before and after cleaning the wafer with formulation E of the present invention.

DETAILED DESCRIPTION OF THE INVENTION, AND PREFERRED EMBODIMENTS THEREOF

Figure 3:
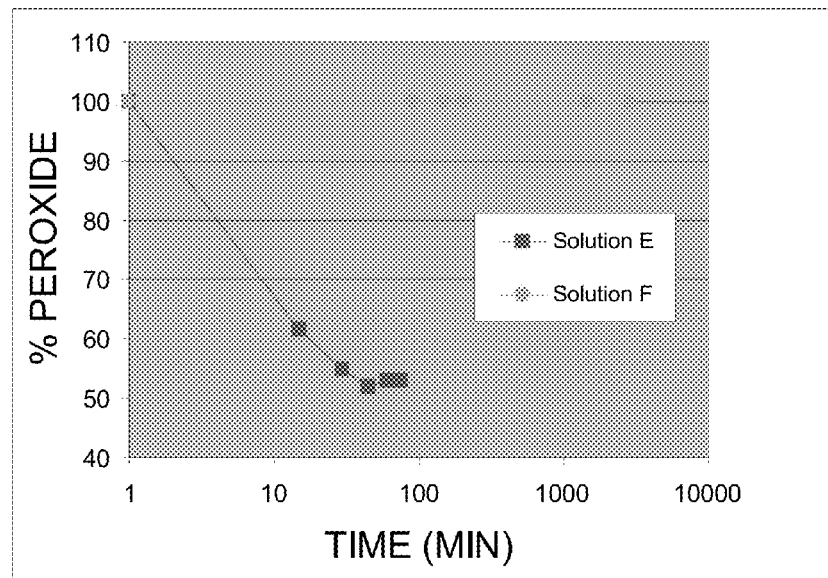
FIG. 3 illustrates the percentage of hydrogen peroxide present in formulations E and F of the present invention as a function of the logarithm of time.

One aspect of the present invention relates to cleaning compositions comprising at least one oxidizer, preferably hydrogen peroxide, and at least one oxidizer stabilizer, preferably an amine-N-oxide. Preferably, the invention relates to oxidizing aqueous compositions for cleaning titanium-containing post-etch residue, polymeric sidewall residue, copper-containing via and line residue and/or hardmask layers from microelectronic devices having said residue and/or layers thereon (see, for example, FIGS. 1A and 1B), said compositions being compatible with ultra low-k (ULK) dielectric materials, such as OSG and porous-CDO, and the metallic interconnect materials, e.g., copper and cobalt, on the microelectronic device surface.

For ease of reference, "microelectronic device" corresponds to semiconductor substrates, flat panel displays, and microelectromechanical systems (MEMS), manufactured for use in microelectronic, integrated circuit, or computer chip applications. It is to be understood that the term "microelectronic device" is not meant to be limiting in any way and includes any substrate that will eventually become a microelectronic device or microelectronic assembly.

As defined herein, "oxidizing agent stabilizer" corresponds to a species which extends the bath-life of the oxidizing agent and is compatible with metal interconnect material (e.g., copper) present on the surface of the microelectronic device. Preferably, in the presence of the oxidizing agent stabilizer, no more than 10% of the oxidizing agent decomposes over a period of 24 hours at temperatures in a range from about 30° C. to about 50° C., more preferably no more than 5% over the same period, most preferably no more than 2% over the same period.

"Post-etch residue" and "post-plasma etch residue," as used herein, corresponds to material remaining following gas-phase plasma etching processes, e.g., BEOL dual-damascene processing. The post-etch residue may be organic, organometallic, organosilicic, or inorganic in nature, for example, silicon-containing material, hardmask capping layer material (e.g., titanium-containing material), nitrogen-containing material, oxygen-containing material, polymeric residue material, copper-containing residue material, etch gas residue such as chlorine and fluorine, and combinations thereof.

As defined herein, "low-k dielectric material" corresponds to any material used as a dielectric material in a layered microelectronic device, wherein the material has a dielectric constant less than about 3.5. Preferably, the low-k dielectric materials include low-polarity materials such as silicon-containing organic polymers, silicon-containing hybrid organic/inorganic materials, organosilicate glass (OSG), TEOS, fluorinated silicate glass (FSG), silicon dioxide, and carbon-doped oxide (CDO) glass. It is to be appreciated that the low-k dielectric materials may have varying densities and varying porosities.

As defined herein, the term "polymeric sidewall residue" corresponds to the residue that remains on the sidewalls of the patterned device subsequent to post-plasma etching processes. The residue is substantially polymeric in nature however, it should be appreciated that inorganic species, e.g., titanium, silicon and/or copper-containing species, may be present in the residue as well.

As used herein, "about" is intended to correspond to ±5% of the stated value.

As used herein, "suitability" for cleaning titanium-containing post-etch residue, polymeric sidewall residue, copper-containing via and line residue and/or hardmask layers from a microelectronic device having said residue and/or material thereon corresponds to at least partial removal of said residue and/or material from the microelectronic device. Preferably, at least about 90% of one or more of the materials, more preferably at least 95% of one or more of the materials, and most preferably at least 99% of one or more of the materials, is removed from the microelectronic device using the compositions of the invention.

"Hardmask capping layer" as used herein corresponds to materials deposited over dielectric material to protect same during the plasma etch step. Hardmask capping layers are traditionally silicon nitrides, silicon oxynitrides and other similar compounds. Hardmask capping layers further contemplated herein include titanium nitride and titanium oxynitride.

As defined herein, "amine species" includes primary amines, secondary amines, tertiary amines and amine-N-oxide species.

Compositions of the invention may be embodied in a wide variety of specific formulations, as hereinafter more fully described.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.001 weight percent, based on the total weight of the composition in which such components are employed.

Titanium nitride compounds are notoriously difficult to etch using the ammonia-containing compositions of the prior art. The present inventors discovered a cleaning composition that is devoid of ammonia and/or strong bases (e.g., NaOH, KOH, etc.) that effectively and selectively removes titanium-containing residues, titanium-containing hardmask materials (e.g., titanium nitride), or both, from the surface of a microelectronic device having same thereon. In addition, the composition has a substantially longer bath-life relative to the ammonia-peroxide compositions of the prior art and will substantially remove polymeric sidewall residue and copper-containing residue. The compositions of the invention may be formulated to substantially remove the titanium-containing residue, the polymeric sidewall residue and/or the copper-containing residue from the surface of the microelectronic device without substantially damaging the underlying ILD, metal interconnect materials, and the hardmask layer. Alternatively, the composition may be formulated to additionally remove the hardmask layer from the surface of the microelectronic device without substantially damaging the underlying low-k dielectric and metal interconnect materials, as described in detail herein.

The oxidizing cleaning compositions of the invention include at least one oxidizing agent, optionally at least one oxidizing agent stabilizer comprising an amine species selected from the group consisting of primary amines, secondary amines, tertiary amines and amine-N-oxides, at least one organic co-solvent, at least one metal-chelating agent, at least one buffering species, and water, for cleaning hardmask layers and/or post-plasma etch residues selected from the group consisting of titanium-containing residues, polymeric residues, copper-containing residues, and combinations thereof. In another embodiment, the oxidizing cleaning compositions of the invention include at least one oxidizing agent, at least one oxidizing agent stabilizer comprising an amine species selected from the group consisting of primary amines, secondary amines, tertiary amines and amine-N-oxides, optionally at least one organic co-solvent, optionally at least one metal-chelating agent, optionally at least one buffering species, and water. In yet embodiment, the oxidizing cleaning compositions of the invention include at least one oxidizing agent, at least one oxidizing agent stabilizer comprising an amine species selected from the group consisting of primary amines, secondary amines, tertiary amines and amine-N-oxides, at least one organic co-solvent, optionally at least one metal-chelating agent, optionally at least one buffering species, and water. In still another embodiment, the oxidizing cleaning compositions of the invention include at least one oxidizing agent, at least one oxidizing agent stabilizer comprising an amine species selected from the group consisting of primary amines, secondary amines, tertiary amines and amine-N-oxides, at least one organic co-solvent, at least one metal-chelating agent, at least one buffering species, and water.

In one aspect, the present invention relates to an oxidizing cleaning composition for cleaning hardmask layers and/or post-plasma etch residues selected from the group consisting of titanium-containing residues, polymeric residues, copper-containing residues, and combinations thereof, said composition including at least one oxidizing agent, at least one oxidizing agent stabilizer comprising an amine species selected from the group consisting of primary amines, secondary amines, tertiary amines and amine-N-oxides, optionally at least one organic co-solvent, optionally at least one metal-chelating agent, optionally at least one buffering species, and water, present in the following ranges, based on the total weight of the composition.

| component | % by weight |
| --- | --- |
| oxidizing agent(s) | about 0.5% to about 20% |
| amine species | about 1% to about 25% |
| organic co-solvent | 0 to about 25 wt. % |
| metal-chelating agent(s) | 0 to about 1% |
| buffer(s) | 0 to about 5% |
| water | about 50% to about 99% |

In the broad practice of the invention, the oxidizing cleaning composition may comprise, consist of, or consist essentially of: (i) at least one oxidizing agent, optionally at least one oxidizing agent stabilizer comprising an amine species selected from the group consisting of primary amines, secondary amines, tertiary amines and amine-N-oxides, at least one organic co-solvent, at least one metal-chelating agent, at least one buffering species, and water; (ii) at least one oxidizing agent, at least one oxidizing agent stabilizer comprising an amine species selected from the group consisting of primary amines, secondary amines, tertiary amines and amine-N-oxides, optionally at least one organic co-solvent, optionally at least one metal-chelating agent, optionally at least one buffering species, and water; (iii) at least one oxidizing agent, at least one oxidizing agent stabilizer comprising an amine species selected from the group consisting of primary amines, secondary amines, tertiary amines and amine-N-oxides, at least one organic co-solvent, optionally at least one metal-chelating agent, optionally at least one buffering species, and water; (iv) at least one oxidizing agent, at least one oxidizing agent stabilizer comprising an amine species selected from the group consisting of primary amines, secondary amines, tertiary amines and amine-N-oxides, at least one organic co-solvent, at least one metal-chelating agent, at least one buffering species, and water; (v) at least one oxidizing agent, at least one amine-N-oxide, optionally at least one organic co-solvent, optionally at least one metal-chelating agent, optionally at least one buffering species, and water; (vi) hydrogen peroxide, at least one amine-N-oxide, optionally at least one organic co-solvent, optionally at least one metal-chelating agent, optionally at least one buffering species, and water; (vii) hydrogen peroxide, at least one amine-N-oxide, at least one organic co-solvent, at least one metal-chelating agent, at least one buffering species, and water; or (viii) hydrogen peroxide, optionally at least one amine-N-oxide, at least one organic co-solvent, at least one metal-chelating agent, at least one buffering species, and water.

The water is preferably deionized. When present, the organic co-solvent(s) are present in an amount from about 0.1 wt. % to about 25 wt. %, the metal chelating agent(s) are present in an amount from about 0.01 wt. % to about 1 wt. %, and the buffering species are present in an amount from about 0.01 wt. % to about 5 wt. %, based on the total weight of the composition.

In a preferred embodiment of the invention, the oxidizing aqueous cleaning composition is substantially devoid of abrasive material(s) typically found in chemical mechanical polishing (CMP) slurries, e.g., silica, alumina, etc., when used to remove post-plasma etch residue and/or hardmask material from the microelectronic device having same thereon, i.e., when used to remove post-etch residue prior to subsequent deposition or layering steps. "Substantially devoid" is defined herein as less than 2 wt. %, preferably less than 1 wt. %, more preferably less than 0.5 wt. %, and most preferably less than 0.1 wt. %. However, it is contemplated herein that the oxidizing aqueous cleaning composition may include abrasive material(s) typically found in chemical mechanical polishing (CMP) slurries, e.g., silica, alumina, etc., for use in chemical mechanical polishing processes, e.g., Step II CMP processing.

It was surprisingly discovered that upon oxidation of the titanium (III) nitride to a titanium (IV) oxide species, the titanium (IV) species was readily soluble in a neutral composition, possibly because of the concurrent presence of other species (e.g., silicon and oxygen-containing species) in the residue. Accordingly, in the broad practice of the invention, the pH range of the oxidizing aqueous cleaning composition is about 3 to about 9, preferably about 6 to about 9, and most preferably about 6.5 to about 8.5.

The oxidizing species contemplated herein include, but are not limited to, hydrogen peroxide ($H_2O_2$), ferric nitrate ($Fe(NO_3)_3$), potassium iodate ($KIO_3$), potassium permanganate ($KMnO_4$), nitric acid ($HNO_3$), ammonium chlorite ($NH_4ClO_2$), ammonium chlorate ($NH_4ClO_3$), ammonium iodate ($NH_4IO_3$), ammonium perborate ($NH_4BO_3$), ammonium perchlorate ($NH_4ClO_4$), ammonium periodate ($NH_4IO_3$), ammonium persulfate ($(NH_4)_2S_2O_8$), tetramethylammonium chlorite ($(N(CH_3)_4)ClO_2$), tetramethylammonium chlorate ($(N(CH_3)_4)ClO_3$), tetramethylammonium iodate ($(N(CH_3)_4)IO_3$), tetramethylammonium perborate ($(N(CH_3)_4)BO_3$), tetramethylammonium perchlorate ($(N(CH_3)_4)ClO_4$), tetramethylammonium periodate ($(N(CH_3)_4)IO_4$), tetramethylammonium persulfate ($(N(CH_3)_4)S_2O_8$), urea hydrogen peroxide ($(CO(NH_2)_2)H_2O_2$), peracetic acid ($CH_3(CO)OOH$), and combinations thereof. Preferably, the oxidizing agent comprises hydrogen peroxide. It is contemplated herein that the oxidizing agent, e.g., $H_2O_2$, may be added directly to the cleaning composition or generated in situ. One preferred aspect of the invention relates to a composition that comprises $H_2O_2$ and may be stored at least 6 hours, more preferably at least 12 hours, even more preferably at least 24 hours, prior to use.

The oxidizing agent stabilizer(s) comprises an amine species including, but not limited to: primary amines such as monoethanolamine, aminoethoxyethanol (diglycolamine), monoisopropanolamine, isobutanolamine, and $C_2$-$C_8$ alkanolamines; secondary amines such as methylethanolamine, N-methylaminoethanol, and diethanolamine; tertiary amines such as triethanolamine, methyldiethanolamine, triethylamine, N,N-dimethylglycolamine, N,N-dimethyldiglycolamine, pentamethyldiethylenetriamine; amine-N-oxides such as N-methylmorpholine-N-oxide (NMMO), trimethylamine-N-oxide, triethylamine-N-oxide, pyridine-N-oxide, N-ethylmorpholine-N-oxide, N-methylpyrrolidine-N-oxide, N-ethylpyrrolidine-N-oxide; and substituted derivatives or combinations thereof such as azoxy, oximes, oxaziranes, and oxazolidines. Preferably, the amine species includes NMMO.

Organic co-solvents contemplated herein include, but are not limited to, ethylene glycol, propylene glycol (PG), neopentyl glycol, 1,3-propanediol, diethyleneglycol, dipropyleneglycol, glycerol, formamide, acetamide, higher amides, N-methylpyrrolidone (NMP), N,N-dimethylformamide, N,N-dimethylacetamide, sulfolane, dimethylsulfoxide (DMSO), γ-butyrolactone, propylene carbonate, diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether (i.e., butyl carbitol), triethylene glycol monobutyl ether, ethylene glycol monohexyl ether, diethylene glycol monohexyl ether, ethylene glycol phenyl ether, propylene glycol methyl ether, dipropylene glycol methyl ether, tripropylene glycol methyl ether, propylene glycol n-propyl ether, dipropylene glycol n-propyl ether (DPGPE), tripropylene glycol n-propyl ether, propylene glycol n-butyl ether, dipropylene glycol n-butyl ether, tripropylene glycol n-butyl ether, propylene glycol phenyl ether, and combinations thereof. Preferably, the organic co-solvent includes butyl carbitol, sulfolane, DMSO, and combinations thereof.

The optional metal-chelating agent(s) in the oxidizing aqueous cleaning composition of the invention is thought to minimize copper dissolution which may be accelerated in the presence of the oxidizing agent(s) of the invention as well as to stabilize the oxidizing agent(s)-containing composition. The optional metal-chelating agent(s) may comprise one or more components including for example, triazoles, such as 1,2,4-triazole (TAZ), or triazoles substituted with substituents such as $C_1$-$C_8$ alkyl, amino, thiol, mercapto, imino, carboxy and nitro groups, such as benzotriazole (BTA), tolyltriazole, 5-phenyl-benzotriazole, 5-nitrobenzotriazole, 3-amino-5-mercapto-1,2,4-triazole, 1-amino-1,2,4-triazole, hydroxybenzotriazole, 2-(5-amino-pentyl)-benzotriazole, 1-amino-1,2,3-triazole, 1-amino-5-methyl-1,2,3-triazole, 3-amino-1,2,4-triazole, 3-mercapto-1,2,4-triazole, 3-isopropyl-1,2,4-triazole, 5-phenylthiol-benzotriazole, halo-benzotriazoles (halo=F, Cl, Br or I), naphthotriazole, and the like, as well as thiazoles, tetrazoles, imidazoles, phosphates, thiols and azines such as 2-mercaptobenzoimidizole (MBI), 2-mercaptobenzothiazole, 4-methyl-2-phenylimidazole, 2-mercaptothiazoline, 5-aminotetrazole (ATA), 5-amino-1,3,4-thiadiazole-2-thiol, 2,4-diamino-6-methyl-1,3,5-triazine, thiazole, triazine, methyltetrazole, 1,3-dimethyl-2-imidazolidinone, 1,5-pentamethylenetetrazole, 1-phenyl-5-mercaptotetrazole, diaminomethyltriazine, mercaptobenzothiazole, imidazoline thione, mercaptobenzimidazole, 4-methyl-4H-1,2,4-triazole-3-thiol, 5-amino-1,3,4-thiadiazole-2-thiol, benzothiazole, tritolyl phosphate, indiazole, ethylenediaminetetraacetic acid (EDTA), 1,2-cyclohexanediamine-N,N,N',N'-tetraacetic acid (CDTA), and combinations thereof. Preferably, the metal chelating-agent includes TAZ and/or CDTA.

The optional buffering species may be included for pH stabilization and/or selective removal of residues from exposed copper surfaces, e.g., open vias. Preferably, the buffer includes tetralkylammonium salts of weak acids, wherein the tetralkylammonium salt includes a tetralkylammonium cation represented by $[NR^1R^2R^3R^4]^+$, where $R^1$, $R^2$, $R^3$ and $R^4$ may be the same as or different from one another and are selected from the group consisting of $C_1$-$C_6$ straight-chained or branched alkyl (e.g., methyl, ethyl, propyl, butyl, pentyl, hexyl) or $C_6$-$C_{10}$ substituted or unsubstituted aryl groups (e.g., benzyl), and the weak acid includes: boric acid; and a carboxylic acid such as lactic acid, maleic acid, ascorbic acid, malic acid, benzoic acid, fumaric acid, succinic acid, oxalic acid, malonic acid, mandelic acid, maleic anhydride, citric acid, phthalic acid, other aliphatic and aromatic carboxylic acids, as well as combinations of the foregoing acids. Preferably, the buffering species includes a tetramethylammonium salt of citric acid or tetramethylammonium salts of boric acid. Tetraalkylammonium hydroxides that are commercially available may be used for production of the preferred tetralkylammonium salt of a weak acid in combination with the aforementioned acid species. For example, tetraethylammonium hydroxide (TEAH), tetramethyammonium hydroxide (TMAH), tetrapropylammonium hydroxide (TPAH) and tetrabutylammonium hydroxide (TBAH) may be used. Tetraalkylammonium hydroxides which are not commercially available may be prepared in a manner analogous to the published synthetic methods used to prepare TMAH, TEAH, TPAH and TBAH, which are known to one ordinary of skill in the art. Most preferably, the buffering species is included when metal chelating agent(s) are present to stabilize the pH of the composition so that the metal will not erode and so that the peroxide does not decompose rapidly.

In addition, the oxidizing aqueous cleaning composition may further include surfactant(s), low-k passivator(s), etchant(s), defoamer(s), etc.

In various preferred embodiments, the oxidizing aqueous cleaning composition is formulated in the following Formulations A-W, wherein all percentages are by weight, based on the total weight of the formulation:

Formulation A: 10.0% N,N-dimethyldiglycolamine; 5.0% hydrogen peroxide; 85.0% water
Formulation B: 11.2% triethanolamine; 5.0% hydrogen peroxide; 83.8% water
Formulation C: 6.6% N,N-dimethylethanolamine; 5.0% hydrogen peroxide; 88.4% water
Formulation D: 4.8% N-methylethanolamine; 5.0% hydrogen peroxide; 90.2% water
Formulation E: 8.3% N,N-dimethyldiglycolamine; 4.2% hydrogen peroxide; 87.5% water
Formulation F: 8.3% NMMO; 4.2% hydrogen peroxide; 87.5% water
Formulation G: 0.1% TAZ; 8.3% NMMO; 4.2% hydrogen peroxide; 87.4% water
Formulation H: 0.1% 1,2,3-benzotriazole; 8.3% NMMO; 4.2% hydrogen peroxide; 87.4% water
Formulation I: 0.2% 1,2,4-triazole; 15% NMMO; 10% hydrogen peroxide; 10% diethylene glycol butyl ether; 0.45% citric acid; 0.55% tetramethylammonium hydroxide; 63.8% water
Formulation J: 0.2% 1,2,4-triazole; 7.5% NMMO; 1% hydrogen peroxide; 10% diethylene glycol butyl ether; 0.45% citric acid; 0.55% tetramethylammonium hydroxide; 80.3% water
Formulation K: 0.1% TAZ; 8.3% NMMO; 8.3% hydrogen peroxide; 81.4% water
Formulation L: 1.2% TAZ; 20% NMMO; 7.2% hydrogen peroxide; 63.4% water
Formulation M: 0.2% TAZ; 13.4% NMMO; 5% hydrogen peroxide; 10% diethylene glycol butyl ether; 71.4% water
Formulation N: 0.2% TAZ; 13.4% NMMO; 10% hydrogen peroxide; 10% diethylene glycol butyl ether; 66.4% water
Formulation O: 0.2% TAZ; 15% NMMO; 10% hydrogen peroxide; 10% diethylene glycol butyl ether; 64.8% water
Formulation P: 0.2% 1,2,4-triazole; 15% NMMO; 1% hydrogen peroxide; 10% diethylene glycol butyl ether; 73.8% water
Formulation Q: 1% hydrogen peroxide; 7.5% NMMO; 10.0% butyl carbitol; 0.2% 1,2,4-triazine; 0.45% citric acid; 0.55% tetramethylammonium hydroxide; 80.3% water
Formulation R: 10% hydrogen peroxide; 7.5% NMMO; 10.0% butyl carbitol; 0.2% 1,2,4-triazine; 0.45% citric acid; 0.55% tetramethylammonium hydroxide; 71.3% water
Formulation S: 0.011% CDTA; 7.5% NMMO; 1.0% hydrogen peroxide; 10% diethylene glycol butyl ether; 0.52% boric acid; 0.22% tetramethylammonium hydroxide; 80.75% water
Formulation T: 0.2% 1,2,4-triazole; 1% hydrogen peroxide; 10% diethylene glycol butyl ether; 0.45% citric acid; 0.55% tetramethylammonium hydroxide; 87.8% water
Formulation U: 0.2% 1,2,4-triazole; 1% hydrogen peroxide; 10% diethylene glycol butyl ether; 88.8% water
Formulation V: 1% hydrogen peroxide; 10.0% butyl carbitol; 0.2% 1,2,4-triazine; 0.45% citric acid; 0.55% tetramethylammonium hydroxide; 87.8% water
Formulation W: 0.011% CDTA; 1.0% hydrogen peroxide; 10% diethylene glycol butyl ether; 0.52% boric acid; 0.22% tetramethylammonium hydroxide; 88.25% water In a preferred embodiment, the oxidizing aqueous composition of the present invention includes the following components present in the following ranges, based on the total weight of the composition.

| Component | % by weight |
| --- | --- |
| hydrogen peroxide | about 2.5% to about 6.5% |
| amine-N-oxide | about 5% to about 10% |
| metal-chelating agent(s) | about 0.01% to about 0.5% |
| Water | balance |

In a particularly preferred embodiment of this invention, the oxidizing cleaning composition comprises hydrogen peroxide, NMMO, at least one metal-chelating agent and water.

In another preferred embodiment, the oxidizing aqueous composition of the present invention includes the following components present in the following ranges, based on the total weight of the composition.

| Component | % by weight |
| --- | --- |
| hydrogen peroxide | about 2.5% to about 12% |
| amine-N-oxide | about 5% to about 20% |
| metal-chelating agent(s) | about 0.01% to about 0.5% |
| organic co-solvent(s) | about 2% to about 15% |
| Water | about 52.5 to about 91% |

In a particularly preferred embodiment of this invention, the oxidizing cleaning composition comprises hydrogen peroxide, NMMO, at least one metal-chelating agent, at least one organic co-solvent, and water.

In yet another preferred embodiment of the present invention, the oxidizing aqueous composition of the present invention includes the following components present in the following ranges, based on the total weight of the composition.

| Component | % by weight |
| --- | --- |
| hydrogen peroxide | about 0.5% to about 12% |
| amine-N-oxide | about 5% to about 20% |
| metal-chelating agent(s) | about 0.01% to about 0.5% |
| organic co-solvent(s) | about 2% to about 15% |
| acid/base buffer(s) | about 0.3 wt. % to about 2 wt. % |
| water | about 51.5 to about 91% |

In a particularly preferred embodiment of this invention, the oxidizing cleaning composition comprises hydrogen peroxide, NMMO, at least one metal-chelating agent, at least one organic co-solvent, at least one buffering species, and water. For example, the oxidizing cleaning composition may include 1,2,4-triazole, NMMO, hydrogen peroxide, diethylene glycol butyl ether, citric acid, tetramethylammonium hydroxide and water. Alternatively, the oxidizing cleaning composition may comprise CDTA, NMMO, hydrogen peroxide, diethylene glycol butyl ether, boric acid, tetramethylammonium hydroxide, and water.

In still another preferred embodiment of the present invention, the oxidizing aqueous composition of the present invention includes at least one oxidizing agent, at least one organic solvent, at least one metal chelating agent, at least one buffering species, and water. For example, the composition may include hydrogen peroxide, CDTA and borate ions (i.e., a tetralkylammonium salt and boric acid).

In another embodiment of the present invention, the oxidizing cleaning composition includes hydrogen peroxide, at least one oxidizing agent stabilizer comprising an amine species selected from the group consisting of primary amines, secondary amines, tertiary amines and amine-N-oxides, optionally at least one organic co-solvent, optionally at least one metal-chelating agent, optionally at least one buffering species, post-plasma etch residue, and water. Preferably, the post-plasma etch residue comprises residue material selected from the group consisting of titanium-containing residue, polymeric-residue, copper-containing residue, and combinations thereof. In yet another embodiment of the present invention, the oxidizing cleaning composition includes hydrogen peroxide, at least one oxidizing agent stabilizer comprising an amine species selected from the group consisting of primary amines, secondary amines, tertiary amines and amine-N-oxides, optionally at least one organic co-solvent, optionally at least one metal-chelating agent, optionally at least one buffering species, hardmask material, and water. Preferably, the hardmask material includes titanium-containing material residue. Importantly, the residue material and/or hardmask material may be dissolved and/or suspended in the cleaning composition of the invention.

The TiN hardmask etch rate is strongly dependent on the concentration of oxidizing agent species. If complete removal of the hardmask is not desirable then a lower concentration of oxidizing agent(s) may be used, e.g., in a range from about 0.5 wt. % to about 3 wt. %, preferably about 0.5 wt. % to about 1.5 wt. %. If complete removal of the hardmask is not desirable, the range of weight percent ratios of the components of the cleaning composition are: about 1:1 to about 20:1 amine species relative to oxidizing agent, more preferably about 2:1 to about 10:1; about 1:1 to about 25:1 organic co-solvent(s) relative to oxidizing agent, preferably about 5:1 to about 15:1; about 0.01:1 to about 0.4:1 metal chelating agent(s) relative to oxidizing agent, preferably about 0.01:1 to about 0.2:1; and about 0.01:1 to about 2:1 buffering agent(s) relative to oxidizing agent, preferably about 0.5:1 to about 1.5:1.

If on the other hand, complete removal of the hardmask is preferred, a higher concentration of oxidizing agent(s) may be used, e.g., in a range from about 5 wt. % to about 15 wt. %, preferably about 7.5 wt. % to about 12.5 wt. %. If complete removal of the hardmask is desirable, the range of weight percent ratios of the components of the cleaning composition are: about 0.1:1 to about 5:1 amine species relative to oxidizing agent, more preferably about 0.75:1 to about 2:1; about 0.1:1 to about 10:1 organic co-solvent(s) relative to oxidizing agent, preferably about 0.5:1 to about 2:1; about 0.01:1 to about 0.4:1 metal chelating agent(s) relative to oxidizing agent, preferably about 0.01:1 to about 0.1:1; and about 0.01:1 to about 1:1 buffering agent(s) relative to oxidizing agent, preferably about 0.01:1 to about 0.5:1.

Concentrated oxidizing aqueous cleaning compositions may be diluted when needed (at the fab, etc.) by adding water to the cleaning composition concentrate. The cleaning composition is preferably diluted (water to cleaning composition) in a range from about 0.1:1 to about 20:1, preferably about 1:1 to about 10:1.

In addition to an aqueous solution, it is also contemplated herein that the oxidizing aqueous cleaning compositions may be formulated as foams, fogs, subcritical or supercritical fluids (i.e., wherein the solvent is $CO_2$, etc., instead of water).

The oxidizing aqueous cleaning compositions of the present invention have an extended bath-life relative to the peroxide-containing baths of the prior art. It is known that hydrogen peroxide-containing compositions will decompose in the presence of trace amounts of metal ions. Accordingly, the decomposition of hydrogen peroxide-containing compositions can be minimized by adding metal ion chelators to the cleaning composition. Preferably, the percentage of peroxide measured at 50° C. in a static oxidizing composition (i.e., no removal processing therein) of the present invention after 24 hours is greater than about 90% of the initial concentration, preferably greater than about 95%, and most preferably greater than about 98%.

Further, said cleaning compositions preferably selectively removes hardmask and/or post-plasma etch residue from the top surface, the sidewalls, and the vias and lines of the microelectronic device without compromising the ILD and/or the metal interconnect layers present on the device. Another advantage associated with the use of the present invention is that no post-clean bake step is necessary to remove volatile materials that may absorb into the pores of the ILD materials.

According to one embodiment, the cleaning composition provides an TiN hardmask etch rate greater than 25 Å min$^{-1}$, preferably greater than 50 Å min$^{-1}$ and/or an TiN/Cu selectivity greater than 10:1, preferably greater than 20:1, more preferably greater than 50:1, even more preferably greater than 100:1, even more preferably 200:1 and most preferably greater than 250:1 when used at temperatures in a range from about 30° C. to about 60° C. Preferably, the compositions have the bath life and/or storage stability described herein thus providing a highly selective cleaning composition with improved storage and usage properties.

The oxidizing aqueous cleaning compositions of the invention are easily formulated by simple addition of the respective ingredients and mixing to homogeneous condition. Furthermore, the oxidizing aqueous cleaning compositions may be readily formulated as single-package formulations or multi-part formulations that are mixed at the point of use, preferably multi-part formulations. The individual parts of the multi-part formulation may be mixed at the tool or in a storage tank upstream of the tool. The concentrations of the respective ingredients may be widely varied in specific multiples of the oxidizing aqueous cleaning composition, i.e., more dilute or more concentrated, in the broad practice of the invention, and it will be appreciated that the oxidizing aqueous cleaning compositions of the invention can variously and alternatively comprise, consist or consist essentially of any combination of ingredients consistent with the disclosure herein.

Accordingly, another aspect of the invention relates to a kit including, in one or more containers, one or more components adapted to form the compositions of the invention. Preferably, the kit includes, in one or more containers, the preferred combination of at least one oxidizing agent stabilizer comprising an amine species selected from the group consisting of primary amines, secondary amines, tertiary amines and amine-N-oxides, at least one organic co-solvent, at least one metal-chelating agent, at least one buffering species, and water for combining with an oxidizing source at the fab or the point of use. According to another embodiment, the kit includes at least one tertiary amine-containing additive, at least one organic co-solvent, at least one buffering agent, at least one metal-chelating agent, and water, for combining with and oxidizing source and water at the fab or the point of use. According to yet another embodiment, the kit includes at least one amine-N-oxide, at least one organic co-solvent, at least one buffering agent, at least one metal-chelating agent, and water, for combining with the oxidizing source and water at the fab or the point of use. According to yet another embodiment, the kit includes at least one amine-N-oxide, at least one organic co-solvent, at least one buffering agent, at least one metal-chelating agent, and water, for combining with the oxidizing source at the fab or the point of use. The containers of the kit must be suitable for storing and shipping said cleaning composition components, for example, NOWPak® containers (Advanced Technology Materials, Inc., Danbury, Conn., USA).

As applied to microelectronic manufacturing operations, the oxidizing aqueous cleaning compositions of the present invention are usefully employed to clean post-plasma etch residue and/or titanium-containing hardmask from the surface of the microelectronic device, and may be applied to said surface before or after the application of other compositions formulated to remove alternative materials from the surface of the device. For example, a composition that preferentially removes copper-containing residues may be applied before or after the cleaning composition of the present invention is applied. Importantly, the cleaning compositions of the invention do not damage ILD materials on the device surface and preferably remove at least 90% of the residue and/or hardmask present on the device prior to removal processing, more preferably at least 95%, and most preferred at least 99%.

In post-plasma etch cleaning and/or titanium-containing hardmask removal application, the oxidizing aqueous cleaning composition is applied in any suitable manner to the device to be cleaned, e.g., by spraying the oxidizing aqueous cleaning composition on the surface of the device to be cleaned, by dipping the device to be cleaned in a static or dynamic volume of the oxidizing aqueous cleaning composition, by contacting the device to be cleaned with another material, e.g., a pad, or fibrous sorbent applicator element, that has the oxidizing aqueous cleaning composition absorbed thereon, or by any other suitable means, manner or technique by which the oxidizing aqueous cleaning composition is brought into removal contact with the device to be cleaned. Further, batch or single wafer processing is contemplated herein.

In use of the compositions of the invention for removing post-plasma etch residue from microelectronic devices having same thereon, the oxidizing aqueous cleaning composition typically is contacted with the device for a time of from about 1 minute to about 60 minutes, at temperature in a range of from about 25° C. to about 70° C., preferably about 30° C. to about 60° C. Such contacting times and temperatures are illustrative, and any other suitable time and temperature conditions may be employed that are efficacious to at least partially remove the post-etch residue material and/or hardmask layer from the device, within the broad practice of the invention. "At least partial removal" of the residue material and/or hardmask layer from the microelectronic device corresponds to at removal of at least 90% of the material, preferably at least 95% removal. Most preferably, at least 99% of said residue material and/or hardmask layer is removed using the compositions of the present invention.

Following the achievement of the desired removal action, the oxidizing aqueous cleaning composition, which is preferably water miscible, is readily removed from the device to which it has previously been applied, e.g., by rinse, wash, or other removal step(s), as may be desired and efficacious in a given end use application of the compositions of the present invention. For example, the device may be rinsed with a rinse solution including deionized water and/or dried (e.g., spin-dry, $N_2$, vapor-dry etc.).

Another aspect of the invention relates to a two-step method of removing post-plasma etch residue material from the surface of the microelectronic device. The first step involves the contacting of the oxidizing aqueous cleaning compositions of the invention with the device for a time of from about 1 minute to about 60 minutes, at temperature in a range of from about 25° C. to about 70° C., preferably about 30° C. to about 60° C. Thereafter, the device is contacted with a dilute hydrofluoric acid composition at temperature in a range from about 20° C. to about 25° C. for 15 seconds to about 60 seconds. The dilute hydrofluoric acid composition may have a dilution in a range from about 100:1 to about 1000:1 (water to HF), preferably about 400:1 to about 600:1. Preferably, the device is rinsed with a rinse composition, e.g., deionized water, subsequent to contact with the oxidizing aqueous cleaning composition and before contact with the dilute HF.

Yet another aspect of the invention relates to the improved microelectronic devices made according to the methods of the invention and to products containing such microelectronic devices.

A still further aspect of the invention relates to methods of manufacturing an article comprising a microelectronic device, said method comprising contacting the microelectronic device with an oxidizing aqueous cleaning composition for sufficient time to clean post-plasma etch residue and/or titanium-containing hardmask from the microelectronic device having said residue and/or material thereon, and incorporating said microelectronic device into said article, wherein the oxidizing aqueous cleaning composition includes at least one oxidizing agent, at least one oxidizing agent stabilizer comprising an amine species selected from the group consisting of primary amines, secondary amines, tertiary amines and amine-N-oxides, optionally at least one organic co-solvent, optionally at least one metal-chelating agent, optionally at least one buffering species, and water.

In yet another embodiment, the oxidizing aqueous cleaning composition of the invention may be utilized in other aspects of the microelectronic device manufacturing process, i.e., subsequent to the post-plasma etch residue cleaning step. For example, the oxidizing aqueous cleaning compositions may be diluted and used as a post-chemical mechanical polishing (CMP) clean. Alternatively, the oxidizing aqueous cleaning compositions of the present invention may be used to remove contaminating materials from photomask materials for re-use thereof.

In still another embodiment, the cleaning compositions of the invention may be combined with abrasive material and used as a Step II CMP slurry. Step II CMP slurries typically have a high barrier material removal rate relative to the removal rate of copper and dielectric material. For example, abrasive material may be added to the cleaning compositions of the invention (to yield a cleaning composition slurry) and used for the Step II CMP of a microelectronic device having tungsten and Ti/TiN barrier layer materials thereon. If the microelectronic device comprises copper material, a copper inhibiting species is preferably added to the cleaning composition slurry to protect the copper during planarization processes. Abrasives contemplated herein includes silica, alumina, ceria and mixtures thereof. Inhibitors contemplated herein include imidazole, aminotetrazole, benzotriazole, benzimidazole, 1,2,4-triazole, 2-mercaptobenzimidazole (MBI), amino, imino, carboxy, mercapto, nitro, alkyl, urea and thiourea compounds, oxalic acid, malonic acid, succinic acid, nitrilotriacetic acid, iminodiacetic acid, and combinations thereof.

The features and advantages of the invention are more fully illustrated by the following non-limiting examples, wherein all parts and percentages are by weight, unless otherwise expressly stated.

Example 1

The etch rates of blanketed titanium nitride and physical vapor deposited (PVD) copper samples in Formulations A-D was determined. The thickness of the TiN and PVD Cu coatings on silicon wafers were measured before and after immersion for 60 minutes in Formulations A-D at the indicated temperatures. Thicknesses were determined using a 4-point probe measurement whereby the resistivity of the composition is correlated to the thickness of the film remaining and the etch rate calculated therefrom. The experimental etch rates are reported in Table 1.

TABLE 1

Etch rate of TiN and PVD Cu in Å min$^{-1}$ after immersion in Formulations A-D.

| Formulation | Temperature/ °C. | Etch rate/Å min$^{-1}$ TiN | PVD Cu | TiN/Cu selectivity |
|---|---|---|---|---|
| A | 20 | 6.3 | 0.07 | 90:1 |
|   | 30 | 11.7 | — | — |
|   | 40 | 18.7 | — | — |
| B | 20 | 33.3 | 0.7 | 48:1 |
| C | 20 | 7.7 | 0.3 | 26:1 |
| D | 20 | 9.6 | 16.7 | 0.58:1 |

It can be seen that at 20° C., Formulation A had the most favorable TiN to Cu etch selectivity. Further, the etch rate of TiN increased as the temperature increased.

Example 2

A sample of low-k dielectric material consisting of a 3500 Å uniform coating of porous CDO having a nominal k-value of 2.5 on a silicon wafer was evaluated for thickness and refractive index both before and after immersion in Formulation E for 10 minutes at 40° C. The thickness and refractive index were measured using spectroscopic ellipsometry. The results are shown in Table 2 hereinbelow.

TABLE 2

Thickness and refractive index of blanketed porous CDO before and after immersion in Formulation E.

|  | pre-clean | post-clean | change |
|---|---|---|---|
| thickness/Å | 3265 | 3279 | +14 |
| refractive index | 1.3693 | 1.3758 | +0.0065 |

It can be seen that the neither the thickness nor the refractive index changed significantly following immersion of the porous CDO in Formulation E. This suggests that the CDO was not substantially etched, which is indicative of negligible change in the dielectric constant.

Referring to FIG. 2, which is the Fourier Transform Infrared (FTIR) Spectrograph of the porous CDO sample before and after immersion in Formulation E. It can be seen that no significant changes in the difference spectrum obtained by subtraction of one spectrum from the other (time a factor of ten) is detectable, indicating that the porous CDO was not compromised by Formulation E.

A test sample was evaluated for cleaning using Formulation E. The test sample consisted of via and trench structures patterned in porous low-k CDO dielectric with a nominal k-value of 2.5. Low-k dielectric over copper metal was exposed at the via bottoms. The dielectric was capped by a 100 Å TiN layer over 400 Å silicon nitride or silicon oxynitride hardmask. Titanium-containing post-etch residue was present on the TiN layer. The piece of the test sample was cleaned by static immersion in Formulation E for 15 minutes at 40° C. then rinsing with water. Evaluation by scanning electron microscopy (SEM) revealed complete removal of titanium-containing residues and the titanium nitride hardmask layer with no observable changes or damage to the dielectric material or corrosion of the copper layer.

Example 3

The bath-life of Formulation E was compared to the bath-life of Formulation F by monitoring the concentration of hydrogen peroxide at 40° C. The relative $H_2O_2$ concentration was measured for a solution aliquot diluted in dilute sulfuric acid. The diluted aliquot was titrated with a solution of about 7.5 w/v % ammonium cerium (IV) sulfate hydrate in dilute sulfuric acid. The relative $H_2O_2$ concentration was determined by the volume ratio of cerium (IV) solution required to reach the end point versus the volume required at zero aging time. The results of the bath-life comparison are shown in FIG. 3. It can be seen that Formulation E, although a promising candidate for the selective and effective removal of titanium-containing post-plasma etch residues, undergoes about 50% $H_2O_2$ decomposition over less than 50 minutes, thereby decreasing the efficacy of said formulation for the residue material over time. In contrast, Formulation F, comprising NMMO, underwent negligible decomposition over more than about 48 hours.

Example 4

The etch rates of blanketed titanium nitride and physical vapor deposited (PVD) copper samples in Formulations F-H was determined. The thickness of silicon wafers having 1000 Å coatings of the respective material were measured before and after immersion for 15 minutes at 50° C. in Formulations F-H as described hereinabove in Example 1. The experimental etch rates are reported in Table 3.

TABLE 3

Etch rate of TiN and PVD Cu in Å min$^{-1}$ after immersion in Formulations F-H.

| Formulation | Etch rate/Å min$^{-1}$ | | TiN/Cu selectivity |
| --- | --- | --- | --- |
| | TiN | PVD Cu | |
| F | 25 | 1.8 | 14:1 |
| G | >50 | 0.2 | >250:1 |
| H | — | 0 | — |

It can be seen that at 50° C., Formulation G including NMMO had the most favorable TiN to Cu etch selectivity. Accordingly, a post-etch dual-damascene sample as described in Example 2 was cleaned by static immersion of the sample and the extent of cleaning determined by SEM, which revealed that the TiN was completely removed from the top surface and sidewalls of the device wafer. Further, the ILD and the copper interconnect material was not damaged.

Example 5

A test sample was evaluated for cleaning using Formulation O. The test sample consisted of via and trench structures patterned in porous low-k CDO dielectric with a nominal k-value of 2.5. Low-k dielectric over copper metal was exposed at the via bottoms. The dielectric was capped by a 100 Å TiN layer over 400 Å silicon nitride or silicon oxynitride hardmask. Titanium-containing post-etch residue was present on the TiN layer. The piece of the test sample was cleaned by static immersion in Formulation O for 6 minutes at 55° C. then rinsing with water. Evaluation by scanning electron microscopy (SEM) revealed complete removal of titanium-containing residues, polymeric sidewall residues and TiN hardmask material with no observable changes or damage to the dielectric material, however, there was no observed removal of the copper-containing residue, e.g., CuO, from the via bottoms.

To assist in the removal of the copper-containing residue, varying amounts of buffering species were added to Formulation O. The formulations tested are enumerated in Table 4.

TABLE 4

Variations of Formulation O having buffering species therein.

| Formulation | buffer: base/acid ratio | wt. % buffer | pH | PVD Cu ER/Å min$^{-1}$ |
| --- | --- | --- | --- | --- |
| O-1 | 0.97 | 0.25 | 6.7 | 13.8 |
| O-2 | 0.97 | 1.3 | 6.3 | 21.6 |
| O-3 | 0.97 | 2.6 | 6.2 | 25.1 |
| O-4 | 1.07 | 0.25 | 6.9 | 11.2 |
| O-5 | 1.07 | 1.3 | 6.7 | 13.8 |
| O-6 | 1.07 | 2.6 | 6.6 | 14.6 |
| O-7 | 1.17 | 0.25 | 7.2 | 9.5 |
| O-8 | 1.17 | 1.3 | 7.0 | 11.3 |
| O-9 | 1.17 | 2.6 | 7.0 | 10.8 |
| I | 1.22 | 1 | 6.9 | not measured |

As reported in Table 4, the etch rates of blanketed PVD copper samples was determined, wherein the thickness of the PVD Cu coating on a silicon wafer was measured before and after immersion for 60 minutes in Formulations O-1 through O-9 at 50° C. Thicknesses were determined using a 4-point probe measurement whereby the resistivity of the composition is correlated to the thickness of the film remaining and the etch rate calculated therefrom. The experimental etch rates are illustrated in FIG. 4.

Figure 4:
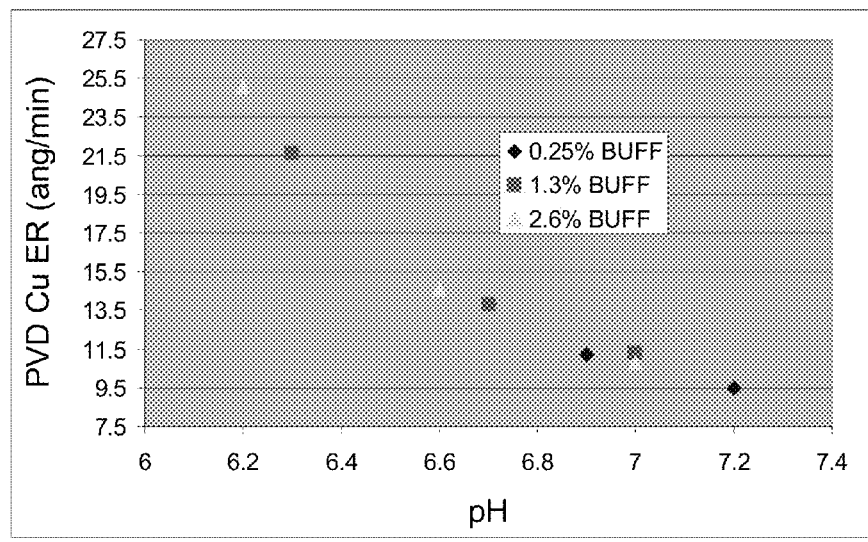
FIG. 4 illustrates the etch rate of PVD deposited copper in Å min$^{-1}$ as a function of the pH of the buffered cleaning composition.

It can be seen in FIG. 4 that the copper etch rates are dependent only on the pH of the composition and not on the amount of buffer. As such, the pH of the composition is chosen so that the etch rate of copper is no more than 10 Å min$^{-1}$.

The aforementioned test sample was cleaned by static immersion in Formulation I for 4 minutes at 55° C. then rinsing with water. As previously introduced, Formulation O, which is devoid of buffering species, did not remove copper-containing residues from the bottom of the vias of the test sample. In contrast, Formulation I, which includes buffering species, completely removed the TiN hardmask and the copper-containing residue following immersion of the test sample in the formulation.

Figure 5:
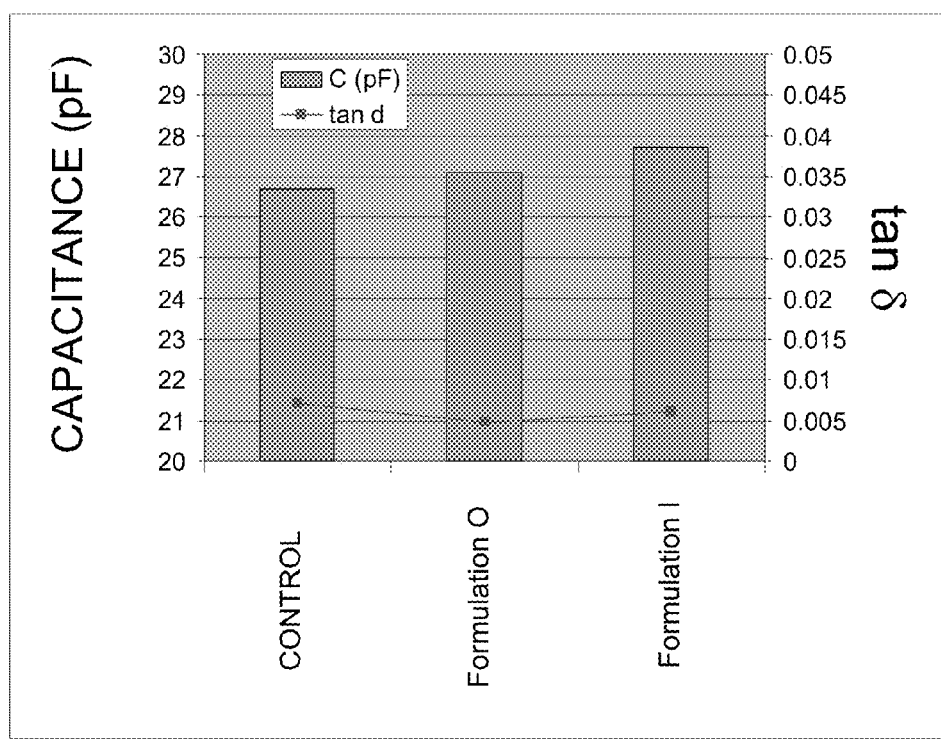
FIG. 5 illustrates the capacitance of a BD2 control wafer relative to the capacitance of a BD2 control wafer following immersion in Formulations O and I at 55° C. for 5 minutes.

The post-clean capacitance of a sample of a porous carbon-doped oxide (CDO) dielectric with k-value of about 2.5 having the tradename BLACK DIAMOND® (BD2) was determined following immersion of blanketed BD2 in Formulation O and Formulation I at 55° C. for 5 minutes. The capacitance was determined using a mercury probe tool with an impedance analyzer. Results are reported as an average of five measurements for each wafer piece. The results of the capacitance experiments are shown in FIG. 5. It can be seen that the capacitance of the BD2 wafer does not substantially increase following immersion in Formulation O or Formulation I, with the small increase within experimental error. Also illustrated in FIG. 5 is the change in tan δ, which is a measure of the dissipative loss in dielectric, which is also within experimental error.

Example 6

A test sample was evaluated for cleaning using Formulations J and P. The test sample consisted of via and trench structures patterned in porous low-k CDO dielectric with a nominal k-value of 2.5. Low-k dielectric over copper metal was exposed at the via bottoms. The dielectric was capped by a 100 Å TiN layer over 400 Å silicon nitride or silicon oxynitride hardmask. Titanium-containing post-etch residue was present on the TiN layer.

One piece of the test sample was cleaned by static immersion in Formulation P for 6 minutes at 60° C. then rinsing with water. Evaluation by scanning electron microscopy (SEM) revealed complete removal of surface residues, polymeric sidewall residues, partial removal of copper-containing residues and minor TiN hardmask etching. As previously discussed, if it is desirable to not remove the TiN hardmask, preferably the formulation includes a small amount of peroxide, e.g., about 1 wt. % at in Formulation P.

The piece of the test sample was also cleaned by static immersion in Formulation J for 1.5 to 4.5 minutes at 40° C. or 50° C. then rinsing with water. Evaluation by scanning electron microscopy (SEM) of the sample cleaned in Formulation J for 4.5 minutes at 40° C. revealed nearly complete removal of surface residues, complete removal of polymeric sidewall residues, partial removal of copper-containing residues and no TiN hardmask etching. Evaluation by scanning electron microscopy (SEM) of the sample cleaned in Formulation J for 3.0 minutes at 50° C. revealed nearly complete removal of surface residues, complete removal of polymeric sidewall residues, complete removal of copper-containing residues and no TiN hardmask etching. In addition, no copper interconnect damage was observed.

Example 7

Figure 6:
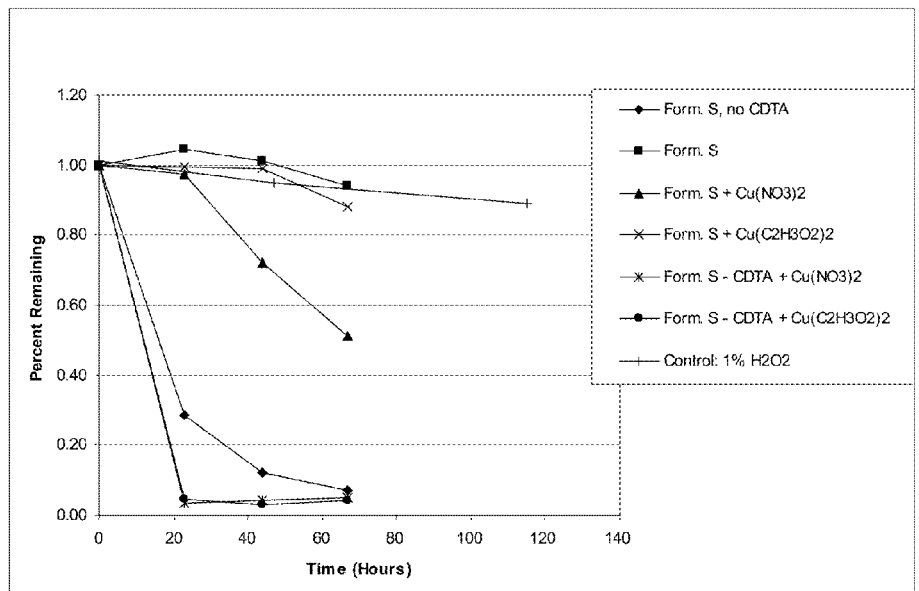
FIG. 6 illustrates the percentage of hydrogen peroxide present in variations of formulation S of the present invention as a function of time.

Variations of Formulation S were analyzed to determine the decomposition rate of $H_2O_2$ at 60° C. with time relative to a control including just 1% $H_2O_2$ in an aqueous solution, as illustrated in FIG. 6. The formulation variations include formulation S, formulation S plus $Cu(NO_3)_2$, formulation S plus $Cu(C_2H_3O_2)_2$, formulation S minus CDTA, formulation S minus CDTA plus $Cu(NO_3)_2$, and formulation S minus CDTA plus $Cu(C_2H_3O_2)_2$. The concentration of the copper (II) salts ranged from 1 ppm to 10 ppm. In the experiments that formulation S was devoid of CDTA, the formulation was also devoid of boric acid, and TAZ and citric acid were present instead.

It can be seen in FIG. 6 that the presence of CDTA in the formulation extends the bathlife of the formulation to at least 24 hours, even in the presence of a $Cu^{2+}$ source such as $Cu(NO_3)_2$ and $Cu(C_2H_3O_2)_2$. Without the CDTA, the composition immediately begins to undergo substantial decomposition. Accordingly, the presence of CDTA stabilizes the oxidizing agent-containing bath, thus extending the lifetime of said bath.

Figure 7:
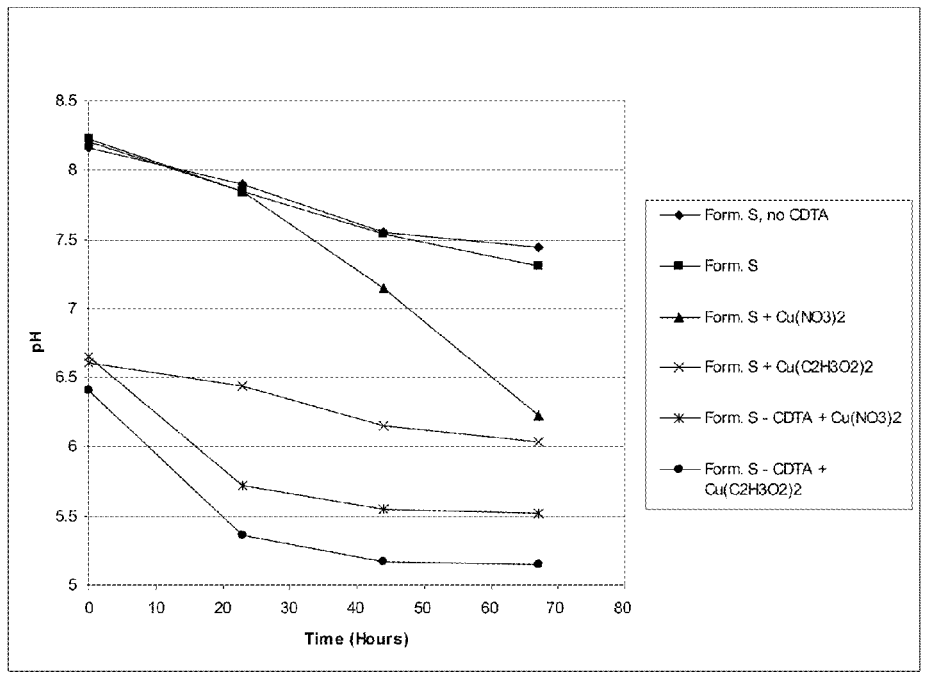
FIG. 7 illustrates the pH of variations of formulation S of the present invention as a function of time.

Referring to FIG. 7, it can be seen that the stability of the oxidizing agent-containing bath is further influenced by the pH of the bath. Comparing the results illustrated in FIG. 6 with those illustrated in FIG. 7, it can be seen that the ideal pH range when CDTA is the metal chelating agent and boric acid is one of the buffering species is about 7.5 to about 8.5 while the ideal pH range when TAZ is the metal chelating agent and citric acid is one of the buffering species is about 6 to about 6.5. As such, buffering species are preferred to maintain the pH in this useful range.

Example 8

A test sample was evaluated for cleaning using Formulation S. The test sample consisted of via and trench structures patterned in porous low-k CDO dielectric with a nominal k-value of 2.5. Low-k dielectric over copper metal was exposed at the via bottoms. The dielectric was capped by a 100 Å TiN layer over 400 Å silicon nitride or silicon oxynitride hardmask. Titanium-containing post-etch residue was present on the TiN layer. The piece of the test sample was cleaned by static immersion in Formulation S for 5 minutes at 50° C. then rinsing with water. Evaluation by scanning electron microscopy (SEM) revealed complete removal of titanium-containing residues from the TiN layer, partial removal of the copper-containing residue, e.g., CuO, from the via bottoms, and no observable changes or damage to the dielectric material or the TiN layer.

The same test sample was then evaluated for cleaning using a two-step process—the first step involving static immersion in Formulation S for 4 minutes at 50° C., and the second step involving static immersion in a dilute hydrofluoric acid solution (400:1 water:HF) for 1 minute at 22° C. The sample was rinsed with deionized water between steps. SEM revealed complete removal of titanium-containing residues from the TiN layer, complete removal of the copper-containing residue from the via bottoms, and no observable changes or damage to the dielectric material or the TiN layer. Importantly, a separate experiment involving a single step cleaning of the same wafer with dilute HF (400:1 water:HF) for 1 minute at 22° C. revealed irregular copper etch loss. Accordingly, the two step process is favored when both titanium-containing residue and copper-containing residue from the via bottoms is preferably substantially removed.

In addition, it is noted that an increased amount of oxidizing agent in the formulation, e.g., 2 wt. % $H_2O_2$ instead of 1 wt. % $H_2O_2$, only increases the etch rate of TiN and does not result in more efficient cleaning of the titanium-containing post-etch residue. Moreover, the remaining TiN layer had a greater surface roughness when exposed to the formulation having the higher $H_2O_2$ concentration.

The post-clean capacitance of BD2 sample was determined (1) following immersion of blanketed BD2 in Formulation S at 50° C. for 5 minutes, and (2) following immersion of blanketed BD2 in Formulation S at 50° C. for 5 minutes following by immersion in dilute HF (400:1) for 1 minute at 22° C. The capacitance was determined using a mercury probe tool with an impedance analyzer. It was determined that formulation S is compatible with the low-k dielectric layer.

Example 9

The etch rates of blanket PVD Cu wafers were measured following immersion of the Cu wafer in (1) Formulation S at 50° C., or (2) dilute HF at various dilutions (100:1, 200:1, 300:1, 400:1, 500:1, 600:1 and 800:1) at 22° C. The etch rate of copper following immersion in formulation S was determined to be about 2.6 Å $min^{-1}$ and the etch rate of copper following immersion in dilute HF was about 3-4 Å $min^{-1}$ and importantly, was not strongly dependent on the extent of dilution.

Example 10

A test sample was evaluated for cleaning using Formulation S using a two-step process—the first step involving static immersion in Formulation S for 5 minutes at 50° C., and the second step involving static immersion in a dilute hydrofluoric acid solution (600:1 water:HF) for 0, 15, 30, 45, and 60 seconds at 22° C. The test sample consisted of via and trench structures patterned in porous low-k CDO dielectric with a nominal k-value of 2.5. Low-k dielectric over copper metal was exposed at the via bottoms. The dielectric was capped by a 100 Å TiN layer over 400 Å silicon nitride or silicon oxynitride hardmask. Titanium-containing post-etch residue was present on the TiN layer. Evaluation by scanning electron microscopy (SEM) revealed complete removal of titanium-containing residues from the TiN layer in each case. When the second step rinse was for 15 or 30 seconds, the copper was clean without any observable undercut and when the second step rinse was for 45 or 60 seconds, the copper was clean however, some undercutting was observed especially at 60 seconds. As such, it was concluded that a 30 second dilute HF clean was sufficient to clean copper residues without undercutting.

Although the invention has been variously disclosed herein with reference to illustrative embodiments and features, it will be appreciated that the embodiments and features described hereinabove are not intended to limit the invention, and that other variations, modifications and other embodiments will suggest themselves to those of ordinary skill in the art, based on the disclosure herein. The invention therefore is to be broadly construed, as encompassing all such variations, modifications and alternative embodiments within the spirit and scope of the claims hereafter set forth.

What is claimed is:

1. An aqueous cleaning composition, comprising at least one oxidizing agent, at least one oxidizing agent stabilizer, at least one organic co-solvent, optionally at least one metal-chelating agent, optionally at least one buffering species, and water, wherein the pH of the cleaning composition is about 3 to about 9, wherein the cleaning composition is devoid of strong bases, wherein the at least oxidizing agent stabilizer comprises an amine species selected from the group consisting of monoethanolamine, aminoethoxyethanol (diglycolamine), monoisopropanolamine, isobutanolamine, methylethanolamine, N-methylaminoethanol, diethanolamine, triethanolamine, methyldiethanolamine, triethylamine, N,N-dimethylglycolamine, N,N-dimethyldiglycolamine, pentamethyldiethylenetriamine, and combinations thereof, and wherein said organic co-solvent comprises a species selected from the group consisting of ethylene glycol, propylene glycol (PG), neopentyl glycol, 1,3-propanediol, diethyleneglycol, dipropyleneglycol, glycerol, formamide, acetamide, higher amides, N-methylpyrrolidone (NMP), N,N-dimethylformamide, N,N-dimethylacetamide, sulfolane, dimethylsulfoxide (DMSO), γ-butyrolactone, propylene carbonate, diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether, triethylene glycol monobutyl ether, ethylene glycol monohexyl ether, diethylene glycol monohexyl ether, ethylene glycol phenyl ether, propylene glycol methyl ether, dipropylene glycol methyl ether, tripropylene glycol methyl ether, propylene glycol n-propyl ether, dipropylene glycol n-propyl ether (DPGPE), tripropylene glycol n-propyl ether, propylene glycol n-butyl ether, dipropylene glycol n-butyl ether, tripropylene glycol n-butyl ether, propylene glycol phenyl ether, and combinations thereof.

2. The aqueous cleaning composition of claim 1, wherein the at least one oxidizing agent comprises a species selected from the group consisting of hydrogen peroxide, ferric nitrate, potassium iodate, potassium permanganate, nitric acid, ammonium chlorite, ammonium chlorate, ammonium iodate, ammonium perborate, ammonium perchlorate, ammonium periodate, ammonium persulfate, tetramethylammonium chlorite, tetramethylammonium chlorate, tetramethylammonium iodate, tetramethylammonium perborate, tetramethylammonium perchlorate, tetramethylammonium periodate, tetramethylammonium persulfate, urea hydrogen peroxide, peracetic acid, and combinations thereof.

3. The aqueous cleaning composition of claim 1, wherein the strong bases comprise KOH and NaOH.

4. The aqueous cleaning composition of claim 1, comprising the at least one metal chelating agent, wherein the metal chelating agent comprises a compound selected from the group consisting of 1,2,4-triazole (TAZ), triazoles substituted with $C_1$-$C_8$ alkyl substituents, triazoles substituted with amino substituents, triazoles substituted with thiol substituents, triazoles substituted with mercapto substituents, triazoles substituted with imino substituents, triazoles substituted with carboxy substituents, triazoles substituted with nitro substituents, benzotriazole, tolyltriazole, 5-phenyl-benzotriazole, 5-nitro-benzotriazole, 3-amino-5-mercapto-1,2,4-triazole, 1-amino-1,2,4-triazole, hydroxybenzotriazole, 2-(5-amino-pentyl)-benzotriazole, 1-amino-1,2,3-triazole, 1-amino-5-methyl-1,2,3-triazole, 3-amino-1,2,4-triazole, 1-amino-1,2,4-triazole, 3-mercapto-1,2,4-triazole, 3-isopropyl-1,2,4-triazole, 5-phenylthiol-benzotriazole, halo-benzotriazoles, naphthotriazole, 2-mercaptobenzoimidizole, 2-mercaptobenzothiazole, 4-methyl-2-phenylimidazole, 2-mercaptothiazoline, 5-aminotetrazole, 5-amino-1,3,4-thiadiazole-2-thiol, 2,4-diamino-6-methyl-1,3,5-triazine, thiazole, triazine, methyltetrazole, 1,3-dimethyl-2-imidazolidinone, 1,5-pentamethylenetetrazole, 1-phenyl-5-mercaptotetrazole, diaminomethyltriazine, mercaptobenzothiazole, imidazoline thione, mercaptobenzimidazole, 4-methyl-4H-1,2,4-triazole-3-thiol, 5-amino-1,3,4-thiadiazole-2-thiol, benzothiazole, tritolyl phosphate, indiazole, ethylenediaminetetraacetic acid (EDTA), 1,2-cyclohexanediamine-N,N,N',N'-tetraacetic acid (CDTA), and combinations thereof.

5. The aqueous cleaning composition of claim 1, wherein the amount of oxidizing agent is in a range from 0.5 wt % to about 20 wt %, based on the total weight of the composition.

6. The aqueous cleaning composition of claim 1, comprising the at least one buffering species, wherein the buffering species comprises a tetralkylammonium cation compound and an acid anion compound, wherein the tetralkylammonium cation compound includes a tetralkylammonium cation represented by the formula $[NR^1R^2R^3R^4]^+$, where $R^1$, $R^2$, $R^3$ and $R^4$ may be the same as or different from one another and are selected from the group consisting of straight-chained $C_1$-$C_6$ alkyls, branched $C_1$-$C_6$ alkyls, substituted $C_6$-$C_{10}$ aryls, unsubstituted $C_6$-$C_{10}$ aryls, and combinations thereof, and wherein the acid anion compound is selected from the group consisting of lactic acid, maleic acid, ascorbic acid, malic acid, benzoic acid, fumaric acid, succinic acid, oxalic acid, malonic acid, mandelic acid, maleic anhydride, citric acid, phthalic acid, boric acid other aliphatic and aromatic carboxylic acids, and combinations of the foregoing acids.

7. The aqueous cleaning composition of claim 1, having a pH in a range from about 6 to about 8.

8. A method of removing post-plasma etch residue and/or hardmask material from a microelectronic device having said residue and/or hardmask thereon, said method comprising contacting the microelectronic device with an aqueous cleaning composition for sufficient time to at least partially clean said residue and/or hardmask from the microelectronic device, wherein the aqueous cleaning composition includes at least one oxidizing agent, at least one oxidizing agent stabilizer, at least one organic co-solvent, optionally at least one metal-chelating agent, optionally at least one buffering species, and water, wherein the pH of the cleaning composition is about 3 to about 9, wherein the cleaning composition is devoid of strong bases, and wherein the at least oxidizing agent stabilizer comprises an amine species selected from the group consisting of monoethanolamine, aminoethoxyethanol (diglycolamine), monoisopropanolamine, isobutanolamine, methylethanolamine, N-methylaminoethanol, diethanolamine, triethanolamine, methyldiethanolamine, triethylamine, N,N-dimethylglycolamine, N,N-dimethyldiglycolamine, pentamethyldiethylenetriamine, and combinations thereof, and wherein said organic co-solvent comprises a species selected from the group consisting of ethylene glycol, propylene glycol (PG), neopentyl glycol, 1,3-propanediol, diethyleneglycol, dipropyleneglycol, glycerol, formamide, acetamide, higher amides, N-methylpyrrolidone (NMP), N,N-dimethylformamide, N,N-dimethylacetamide, sulfolane, dimethylsulfoxide (DMSO), γ-butyrolactone, propylene carbonate, diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether, triethylene glycol monobutyl ether, ethylene glycol monohexyl ether, diethylene glycol monohexyl ether, ethylene glycol phenyl ether, propylene glycol methyl ether, dipropylene glycol methyl ether, tripropylene glycol methyl ether, propylene glycol n-propyl ether, dipropylene glycol n-propyl ether (DPGPE), tripropylene glycol n-propyl ether, propylene glycol n-butyl ether, dipropylene glycol n-butyl ether, tripropylene glycol n-butyl ether, propylene glycol phenyl ether, and combinations thereof.

9. The method of claim 8, wherein the at least one oxidizing agent comprises a species selected from the group consisting of hydrogen peroxide, ferric nitrate, potassium iodate, potassium permanganate, nitric acid, ammonium chlorite, ammonium chlorate, ammonium iodate, ammonium perborate, ammonium perchlorate, ammonium periodate, ammonium persulfate, tetramethylammonium chlorite, tetramethylammonium chlorate, tetramethylammonium iodate, tetramethylammonium perborate, tetramethylammonium perchlorate, tetramethylammonium periodate, tetramethylammonium persulfate, urea hydrogen peroxide, peracetic acid, and combinations thereof.

10. The method of claim 8, wherein said aqueous cleaning composition comprises at least one metal chelating agent selected from the group consisting of 1,2,4-triazole (TAZ), triazoles substituted with $C_1$-$C_8$ alkyl substituents, triazoles substituted with amino substituents, triazoles substituted with thiol substituents, triazoles substituted with mercapto substituents, triazoles substituted with imino substituents, triazoles substituted with carboxy substituents, triazoles substituted with nitro substituents, benzotriazole, tolyltriazole, 5-phenyl-benzotriazole, 5-nitro-benzotriazole, 3-amino-5-mercapto-1,2,4-triazole, 1-amino-1,2,4-triazole, hydroxybenzotriazole, 2-(5-amino-pentyl)-benzotriazole, 1-amino-1,2,3-triazole, 1-amino-5-methyl-1,2,3-triazole, 3-amino-1,2,4-triazole, 3-mercapto-1,2,4-triazole, 3-isopropyl-1,2,4-triazole, 5-phenylthiol-benzotriazole, halo-benzotriazoles, naphthotriazole, 2-mercaptobenzoimidizole, 2-mercaptobenzothiazole, 4-methyl-2-phenylimidazole, 2-mercaptothiazoline, 5-aminotetrazole, 5-amino-1,3,4-thiadiazole-2-thiol, 2,4-diamino-6-methyl-1,3,5-triazine, thiazole, triazine, methyltetrazole, 1,3-dimethyl-2-imidazolidinone, 1,5-pentamethylenetetrazole, 1-phenyl-5-mercaptotetrazole, diaminomethyltriazine, mercaptobenzothiazole, imidazoline thione, mercaptobenzimidazole, 4-methyl-4H-1,2,4-triazole-3-thiol, 5-amino-1,3,4-thiadiazole-2-thiol, benzothiazole, tritolyl phosphate, indiazole, ethylenediaminetetraacetic acid (EDTA), 1,2-cyclohexanediamine-N,N,N',N'-tetraacetic acid (CDTA), and combinations thereof.

11. The method of claim 8, wherein the amount of oxidizing agent is in a range from 0.5 wt % to about 20 wt %, based on the total weight of the composition.

12. The method of claim 8, wherein said composition has a pH in a range of from about 6 to about 8.

13. The method of claim 8, wherein the contacting comprises a process selected from the group consisting of: spraying the aqueous composition on a surface of the microelectronic device; dipping the microelectronic device in a sufficient volume of aqueous composition; contacting a surface of the microelectronic device with another material that is saturated with the aqueous composition; and contacting the microelectronic device with a circulating aqueous composition.

14. The method of claim 8, further comprising rinsing the microelectronic device with deionized water following contact with the aqueous composition.

15. The method of claim 8, further comprising contacting the microelectronic device with dilute hydrofluoric acid.

* * * * *